United States Patent [19]

Nakata

[11] 4,081,818

[45] Mar. 28, 1978

[54] SEMICONDUCTOR TEMPERATURE SENSITIVE SWITCHING DEVICE WITH SHORT CARRIER LIFETIME REGION

[75] Inventor: Jòsuke Nakata, Itami, Japan

[73] Assignee: Mitsubishi Denki Kabushiki Kaisha, Tokyo, Japan

[21] Appl. No.: 732,545

[22] Filed: Oct. 14, 1976

[30] Foreign Application Priority Data

Oct. 17, 1975 Japan .................................. 50-124915

[51] Int. Cl.² .................... H01L 23/56; H01L 29/66; H01L 29/72; H01L 29/74

[52] U.S. Cl. ...................................... 357/28; 357/35; 357/38; 357/64

[58] Field of Search ...................... 357/28, 35, 38, 64

[56] References Cited

U.S. PATENT DOCUMENTS

| | | | |
|---|---|---|---|
| 3,274,400 | 9/1966 | Weinstein | 357/28 |
| 3,312,880 | 4/1967 | Longo et al. | 357/64 |
| 3,487,276 | 12/1969 | Wolley | 357/64 |
| 3,513,367 | 5/1970 | Wolley | 357/64 |
| 3,671,821 | 6/1972 | Nakata et al. | 357/64 |
| 3,947,864 | 3/1976 | Yatsuo | 357/64 |
| 4,007,475 | 2/1977 | Collumeau | 357/64 |
| 4,010,486 | 3/1977 | Suzuki | 357/28 |

*Primary Examiner*—Andrew J. James
*Attorney, Agent, or Firm*—Oblon, Fisher, Spivak, McClelland & Maier

[57] ABSTRACT

A semiconductor heat sensitive switching device comprises a first semiconductor layer having the first conductive type;

a second semiconductor layer having the second conductive type for forming the first emitter PN junction which is disposed in the first semiconductor layer to be substantially parallel of one main surface to the bottom surface and to contact them at the end; and a third semiconductor layer having the second conductive type for forming the collector PN junction which is disposed in the first semiconductor layer with a space to the second semiconductor layer to be substantially parallel of one main surface to the bottom surface and to contact them at the end, and a high thermal carrier generation rate region which is formed in the depletion layer region of the bottom surface of the third semiconductor layer.

8 Claims, 2 Drawing Figures

SEMICONDUCTOR TEMPERATURE SENSITIVE SWITCHING DEVICE WITH SHORT CARRIER LIFETIME REGION

BACKGROUND OF THE INVENTION

1 Field of the Invention

The present invention relates to a semiconductor heat sensitive switching device having PNPN junction.

2. Description of the Prior Art

It has been known to use semiconductor heat sensitive switching device for switching it by providing outer thermal energy instead of switching semi-conductor PNPN switching devices made of silicon etc., from the OFF state to the ON state by passing the gate current to the switching device in Japanese Patent Publication No. 33992/1972. (British Pat. No. 1,254,500 and West German Patent No. 1,943,193).

The typical semiconductor heat sensitive switching device is a heat sensitive thyristor having PNPN junction. A combination of transistor type heat sensitive device having PNP junction and one having NPN junction can be also used as the semiconductor heat sensitive switching device. The heat sensitive thyristor will be mainly illustrated.

In the specification, the minimum temperature required for switching the heat sensitive thyristor from the OFF state to the ON state under applying constant forward voltage (OF voltage) in the opening of the gate terminal is referred to as breakover temperature.

The minimum temperature required for extinction of forward blocking state (OFF state) in the main-voltage main-current characteristics in the opening of the gate terminal is referred to as inherent switch temperature. In order to decrease the range of the temperature for actuating the heat sensitive thyristor, there is a method of electrically decreasing it by utilizing the gate terminal. However, in many cases, it is desired to use it without such outer means by improving the heat sensitive thyristor itself to decrease the breakover temperature and the inherent switch temperature. The breakover temperature and the inherent switch temperature are respectively the temperature for providing unity of the sum of the common base current amplification factors $\alpha_1$ and $\alpha_2$ of the PNP transistor part and the NPN transistor part in the PNPN junction. In order to decrease the temperature, it is necessary to increase $\alpha_1$ and $\alpha_2$ at low temperature to provide unity of the sum thereof.

In the conventional thyristor for triggering by the gate current or luminescence, it is designed to have high breakover temperature for preventing thermal breakover. The breakover temperature is usually 100° to 150° C under applying the rated OFF state voltage and the inherent switch temperature is usually about 50° C above the breakover temperature. When the thyristor having such temperature characteristics is used at lower temperature, it is necessary to apply the gate forward bias. In the method, the switch temperature is disadvantageously varied in high sensitive to the variation of the bias voltage.

Accordingly, the thyristor could not practically used as the heat sensitive switch.

In order to obtain a heat sensitive thyristor for switching it at a predetermined temperature without substantial effect caused by the variation of the applied voltage under lowering the switch temperature without the gate forward bias, it is necessary to have the characteristic of high temperature dependency of the reverse current of the collector junction (central junction) in the PNPN junction and the characteristic for rapidly providing unity of the sum of the common base current amplification factors $\alpha_1$ and $\alpha_2$ at low temperature by the increase of the collector current (rise of temperature).

SUMMARY OF THE INVENTION

It is an object of the present invention to provide an improved semiconductor heat sensitive switching device.

Another object of the invention is to provide a semiconductor heat sensitive switching device which has high temperature dependency of the forward breakover voltage without decreasing the forward blocking voltage.

The object of the invention is to provide a semiconductor heat sensitive switching device which has the above-mentioned characteristics and has a simple structure to be easily prepared.

DETAILED DESCRIPTION OF THE PREFERRED EMBODIMENT

Figure 1:
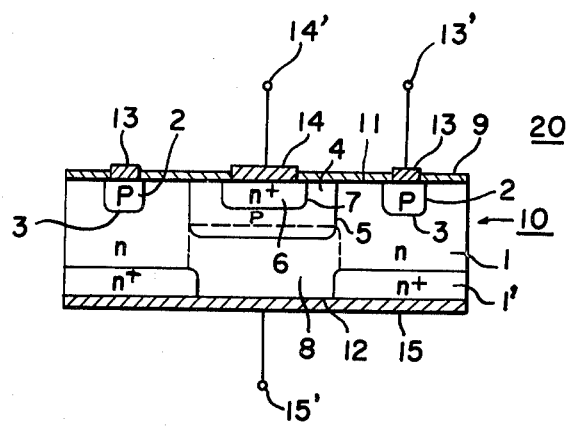
FIG. 1 is a sectional view of one embodiment of the heat sensitive thyristor according to the invention.

FIG. 1 is a sectional view of one embodiment of the heat sensitive thyristor (20) of the invention.

In FIG. 1, the reference numeral 10 designates a silicon pellet having a PNPN junction and a pair of electrodes which is prepared by cutting a silicon wafer (many wafers having same structure are simultaneously formed). The reference numeral 1 designates a N-type base region having high resistivity; 2 designates a ring shape P-type emitter region which is formed by diffusing boron from the first main surface 11 to the N-type base region 1; 3 designates an anode emitter junction which is boundary between the N-type base region 1 and the P-type emitter region 2; 4 designates a P-type base region which is formed by diffusing boron from the first main surface 11 of the silicon pellet to the N-type base region 1 to have the concentric circle shape to the P-type emitter region 2; 5 designates a collector junction of the boundary between the N-type base 1 and the P-type base 4; 6 designates a N-type emitter region which is formed by diffusing phosphorous to the P-type base region 4 to have the concentric circle shape to the P-type emitter region 2; 7 designates a cathode emitter junction of the boundary between the P-type base region 4 and the N-type emitter region 6; 1' designates a N+ base region which is formed by diffusing phosphorus from the second main surface 12 in annular shape so as to have concentric circular opening to the P-type base region 4; and 8 designates a high thermal carrier generation rate region which is formed by diffusing gold from the opening of the N+ base region 1'.

The high thermal carrier generation rate region 8 is formed by diffusing gold through the bottom of the collector junction 5 faced to the main surface 12 of the silicon pellet 10 by the masking effect of the N+ base region 1' formed by the diffusion of phosphorus to gold.

The life time of the carriers in the region is remarkably shorter than that of the other part of the base region 1, 4, and accordingly, the rate of generation of hole-electron pair caused by the rise of the temperature is remarkably higher than that of the other part.

The reference numeral 9 designates passivation layer such as silicon oxide film which is coated on the first main surface 11; 13, 14 and 15 respectively designate an anode, a cathode and a N gate electrode which are contacted in low resistance with the P-type emitter region 2, the N-type emitter region 6 and N+ base region 1' and 13', 14' and 15' designate the outer terminals for 13, 14 and 15 respectively.

As it is clear from FIG. 1, the heat sensitive thyristor 20 has a lateral type structure wherein PNPN junctions are disposed in lateral direction in the silicon pellet 10.

When an ambient temperature is enough low and positive voltage is applied to the anode 13 and negative voltage is applied to the cathode 14 under the opening of the N-gate electrode, the voltage-current characteristics having OFF state and ON state with the boundary in certain voltage as those of the conventional thyristor.

When the ambient temperature rises in the OFF state, the reverse current of the collector junction 5 is increased by thermally generated carriers in the depletion layer and near the depletion layer. This is increased depending upon the increase of the hole-electron pairs. The reverse current also pass through the anode emitter junction 3 and the cathode emitter junction 7 whereby the amount of the holes injected from the P-type emitter region to the N-type base region 1 and the amount of electrons injected from the N-type emitter region 6 to the P-type base region 4 are respectively increased.

The life time of the injected carriers is prolonged depending upon rising the temperature whereby the amount of the injected carriers fed to the collector junction 5 that is the current amplification factors $\alpha_1$, $\alpha_2$ are also increased. As the result, the forward blocking voltage (breakover voltage $V'_{BO}$) between the anode 13 and the cathode 14 is decreased depending upon rising the temperature whereby it is switched from the OFF state to the ON state at certain temperature under applying a constant voltage.

Figure 2:
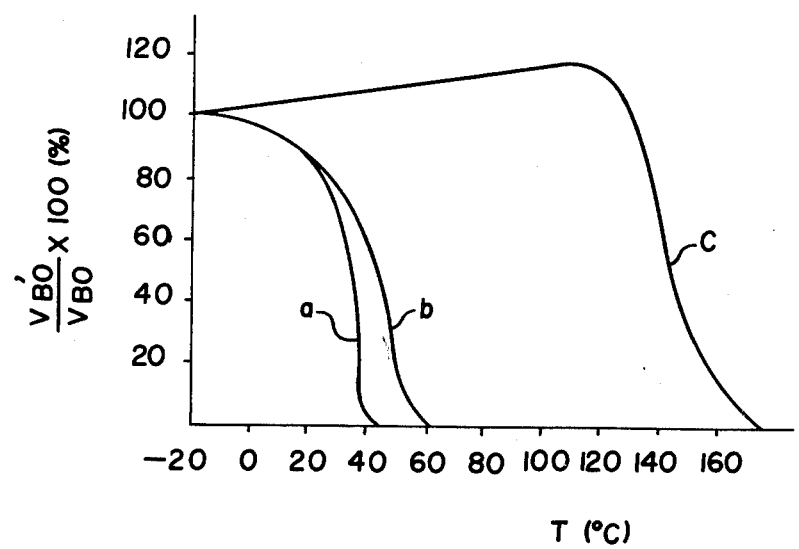
FIG. 2 is a graph showing the relationship of the temperature and the forward breakover voltages of the heat sensitive thyristor of the invention and the conventional thyristor.

FIG. 2 is a graph showing the relationship between the temperature and the forward breakover voltage of the thyristor under opening the gate electrode.

The ambient temperature T is shown in the abscissas and the ratio of the forward breakover voltage $V'_{BO}$ at each temperature to the forward breakover voltage $V_{BO}$ at $-20°$ C which is shown by percent is shown in the ordinates.

The curve $a$ shows the characteristic of the heat sensitive thyristor 20 of the invention.

The curve $b$ shows the characteristic of the thyristor which has no high thermal carrier generation rate region 8 formed by the diffusion of gold.

The curve $c$ shows the characteristic of the conventional thyristor which is triggered by the gate current. The latter is shown as the reference. The breakover temperature can be decreased by increasing the injection efficiency of the carriers by increasing the ratio of the impurity concentrations of the base and the emitter in the emitter junction, and by reducing the distance between each emitter junction and the collector junction in pair.

But this method is too much utilized, it becomes difficult to obtain the device having high forward blocking voltage and the device is limited to be the application of low voltage.

In accordance with the invention to dispose the gold fiffusion region which impart easily thermal generation of the carriers, near the collector junction, the values $\alpha_1$, $\alpha_2$ can be increased without the above-mentioned method, to decrease the breakover temperature as desired. Moreover, the characteristic for rapidly decreasing the breakover voltage $V'_{BO}$ depending upon rising the temperature can be attained.

The control of the temperature for initiating the rapid decrease of the break-over voltage can be attained by the control of the density of the carrier generation-recombination center such as gold introducing into the high thermal carrier generation rate region 8.

In the embodiment for diffusing gold, the concentration of the gold is controlled by the temperature and the time for diffusing gold.

The characteristic of the invention is to form the heat sensitive collector region which is formed by introducing the carrier generation-recombination center such as gold from the main surface 11 having the laterial PNPN junction region and the opposite main surface 12 at the part of the collector junction 5 which are not lied between the anode emitter junction 3 and the cathode emitter junction 7.

Accordingly, the device having the characteristic for rapidly decreasing the breakover voltage at relatively low temperature can be easily obtained and moreover, the life time of the carriers in the lateral PNPN junction region is not shortened whereby the voltage drop (ON state voltage) under the forward conducting state can be advantageously small.

The invention can be applied for not only the thyristor having the structure of FIG. 1 but also the two ways heat sensitive thyristor wherein the lateral PNPN junctions are formed in reverse parallel in one semiconductor pellet, and the lateral PNP heat sensitive transistor wherein the P+-type region is formed instead of the N-type emitter region 6 and the emitter 2, the base 1 and the collector 4 are formed.

The heat switching device for switching at the specific temperature as the heat sensitive thyristor can be obtained by combining the PNP heat sensitive transistor and another NPN heat sensitive transistor.

In the above-mentioned embodiment, the high thermal carrier generation rate region 8 is formed by diffusing gold. It is possible to diffuse an impurity for giving deep energy level in the semiconductor such as silicon and germanium. The impurity can be copper, iron, nickel, etc. It is also possible to introduce many carrier generation-recombination centers by irradiating electron or gamma rays to form the lattice defect.

In all cases, the impurity or the lattice defect is introduced from the main surface 12 to near the bottom of the collector junction 5 whereby the characteristics of the collector junction 5 that is the temperature characteristics of the forward breakover voltage can be easily controlled without decreasing the life time at the thyristor part having the PNPN junction in lateral.

In FIG. 1, N gate electrode 15 is disposed in the N-type base region. It is possible to dispose the P gate electrode in the P-type base region. The gate electrode can be used for adjusting the switching temperature to higher level by connecting a resistor between the adjacent emitter electrodes or for turning off by applying reverse bias to the gate.

What is claimed is:

1. A semiconductor heat sensitive switching device having high temperature dependency of the forward breakover voltage without decreasing the forward blocking voltage comprising:
- a first semiconductor layer of a first conductive type;
- a second semiconductor layer of a secnd conductive type opposite to the first conductive type for forming a first emitter PN junction disposed in the first semiconductor layer;
- a third semiconductor layer of the second conductive type having a depletion layer region for forming a collector PN junction disposed in the first semiconductor layer; and
- a high thermal carrier generation rate region formed in the depletion layer region of the third semiconductor layer.

2. A semiconductor heat sensitive switching device according to claim 1 further comprising a fourth semiconductor layer of the first conductive type for forming a second emitter PN junction disposed in the third semiconductor layer.

3. A semiconductor heat sensitive switching device according to claim 2 wherein the fourth semiconductor layer contains an impurity of a concentration higher than that of the third semiconductor layer.

4. A semiconductor heat sensitive switching device according to claim 1 wherein the high thermal carrier generation rate region is formed by a diffusion of a deep level impurity.

5. A semiconductor heat sensitive switching device according to claim 4 wherein the impurity is selected from a group consisting of gold, copper, iron and nickel.

6. A semiconductor heat sensitive switching device according to claim 1 wherein the high thermal carrier generation rate region is formed by irradiating electron rays or gamma rays.

7. A semiconductor heat sensitive switching device according to claim 2 wherein the second semiconductor layer is ring shaped and surrounds the third and fourth semiconductor layers.

8. A semiconductor heat sensitive switching device according to claim 2 further comprising
- a gate electrode disposed on a main surface of the first semiconductor layer;
- an anode electrode disposed on the second semiconductor layer; and
- a cathode electrode disposed on the fourth semiconductor layer.

* * * * *